United States Patent
Bober

(10) Patent No.: US 9,164,151 B2
(45) Date of Patent: Oct. 20, 2015

(54) SYSTEM AND METHOD FOR DETERMINING ISOLATION RESISTANCES OF A BATTERY PACK

(71) Applicant: LG Chem, Ltd., Seoul (KR)

(72) Inventor: Greg Bober, Saint Clair Shores, MI (US)

(73) Assignee: LG Chem, Ltd., Seoul (KR)

(*) Notice: Subject to any disclaimer, the term of this patent is extended or adjusted under 35 U.S.C. 154(b) by 270 days.

(21) Appl. No.: 13/961,834

(22) Filed: Aug. 7, 2013

(65) Prior Publication Data
US 2015/0042350 A1 Feb. 12, 2015

(51) Int. Cl.
*G01N 27/416* (2006.01)
*G01R 31/36* (2006.01)
*G01R 27/14* (2006.01)

(52) U.S. Cl.
CPC ........ *G01R 31/3662* (2013.01); *G01R 31/3627* (2013.01); *G01R 27/14* (2013.01)

(58) Field of Classification Search
CPC .............................. G01R 31/3662; G01R 27/14
USPC .................................... 320/134, 162; 324/430
See application file for complete search history.

(56) References Cited

U.S. PATENT DOCUMENTS

| | | | |
|---|---|---|---|
| 4,214,204 A | 7/1980 | Eberle | |
| 4,311,917 A | 1/1982 | Hencey, Jr. et al. | |
| 4,363,407 A | 12/1982 | Buckler et al. | |
| 5,357,423 A | 10/1994 | Weaver et al. | |
| 5,901,572 A | 5/1999 | Peiffer et al. | |
| 6,138,466 A | 10/2000 | Lake et al. | |
| 6,762,610 B1 | 7/2004 | Brilmyer et al. | |
| 7,109,700 B2 | 9/2006 | Fazzina | |
| 7,564,248 B2 | 7/2009 | Breese et al. | |
| 7,915,856 B2 | 3/2011 | Krampitz et al. | |

(Continued)

FOREIGN PATENT DOCUMENTS

| | | |
|---|---|---|
| GB | 2291737 A | 1/1996 |
| JP | S5999271 A | 6/1984 |

(Continued)

OTHER PUBLICATIONS

International Search Report for International application No. PCT/KR2012/009014 dated Feb. 28, 2013.

*Primary Examiner* — Edward Tso
*Assistant Examiner* — Aaron Piggush
(74) *Attorney, Agent, or Firm* — Buckert Patent & Trademark Law Firm, PC; John F. Buckert

(57) ABSTRACT

A system for determining isolation resistances of a battery pack includes a voltage source, a voltage meter, and a microprocessor. The voltage source is disposed external of the battery pack. The voltage source applies an output voltage on first and second electrical terminals. The voltage meter measures a first voltage level between the first electrical terminal and the housing, and a second voltage level between the first electrical terminal and the housing when a resistor is electrically coupled between the first electrical terminal and the housing. The voltage meter measures a third voltage level between the second electrical terminal and the housing, and a fourth voltage level between the second electrical terminal and the housing when the resistor is electrically coupled between the second electrical terminal and the housing. The microprocessor determines a first isolation resistance value based on the first, second, and third voltage levels.

5 Claims, 4 Drawing Sheets

(56) References Cited

U.S. PATENT DOCUMENTS

| | | |
|---|---|---|
| 7,974,797 B2 | 7/2011 | Shoji |
| 8,168,315 B1 * | 5/2012 | Hermann .................. 429/92 |
| 8,487,631 B2 | 7/2013 | Yuasa et al. |
| 2001/0019270 A1 | 9/2001 | Onishi et al. |
| 2002/0062650 A1 | 5/2002 | Dukhan et al. |
| 2002/0193955 A1 | 12/2002 | Bertness et al. |
| 2003/0139888 A1 | 7/2003 | Burns |
| 2004/0108856 A1 | 6/2004 | Johnson |
| 2004/0204172 A1 | 10/2004 | Herle |
| 2005/0023054 A1 | 2/2005 | Weidenheimer et al. |
| 2005/0035743 A1 * | 2/2005 | Kawakami et al. ......... 320/162 |
| 2005/0134283 A1 | 6/2005 | Potempa |
| 2005/0257533 A1 | 11/2005 | Gunawardana et al. |
| 2005/0264296 A1 | 12/2005 | Philbrook |
| 2006/0012341 A1 | 1/2006 | Burns |
| 2006/0164034 A1 | 7/2006 | Hanyu et al. |
| 2007/0252555 A1 | 11/2007 | Potempa |
| 2007/0261415 A1 | 11/2007 | Barnes |
| 2008/0231257 A1 | 9/2008 | Williams |
| 2008/0290877 A1 | 11/2008 | Oh et al. |
| 2009/0243621 A1 | 10/2009 | Kudo et al. |
| 2009/0251149 A1 | 10/2009 | Buckner et al. |
| 2010/0102975 A1 | 4/2010 | Vossmeyer et al. |
| 2011/0050235 A1 | 3/2011 | Bogdan, Jr. et al. |
| 2011/0115490 A1 | 5/2011 | Klijn |
| 2011/0116225 A1 | 5/2011 | Staben et al. |
| 2011/0254558 A1 | 10/2011 | Stancu et al. |
| 2011/0256430 A1 | 10/2011 | Stancu et al. |
| 2011/0300416 A1 | 12/2011 | Bertness |
| 2012/0014020 A1 | 1/2012 | Lehmann |
| 2013/0015702 A1 | 1/2013 | Ito |
| 2013/0027049 A1 | 1/2013 | Sukup |
| 2013/0119937 A1 | 5/2013 | Arseneault et al. |
| 2013/0141105 A1 | 6/2013 | Tom et al. |
| 2014/0084934 A1 | 3/2014 | Bober |

FOREIGN PATENT DOCUMENTS

| | | |
|---|---|---|
| JP | H0797004 A | 4/1995 |
| JP | 1996163704 | 6/1996 |
| JP | H08185896 A | 7/1996 |
| JP | H1140212 A | 2/1999 |
| JP | 2002343318 A | 11/2002 |
| JP | 2005228659 A | 8/2005 |
| JP | 2007280794 A | 10/2007 |
| JP | 2010236981 A | 10/2010 |
| JP | 2012165536 | 4/2011 |
| KR | 20040072069 A | 8/2004 |
| KR | 20050001008 A | 1/2005 |
| KR | 20060068172 A | 6/2006 |
| KR | 20090015273 A | 2/2009 |
| KR | 20090024573 A | 9/2009 |
| KR | 20100003136 A | 1/2010 |
| KR | 20100105954 A | 10/2010 |
| KR | 20110064057 A | 6/2011 |
| KR | 20120029850 | 3/2012 |
| KR | 20120030198 | 3/2012 |
| KR | 20120057385 A | 6/2012 |
| KR | 20130080579 | 7/2013 |

* cited by examiner

SYSTEM AND METHOD FOR DETERMINING ISOLATION RESISTANCES OF A BATTERY PACK

BACKGROUND

The inventor herein has recognized a need for an improved system and an improved method for determining isolation resistances of a battery pack.

SUMMARY

A system for determining isolation resistances of a battery pack in accordance with an exemplary embodiment is provided. The battery pack has a housing and at least first and second battery modules disposed in the housing. The battery pack further includes first and second electrical terminals. The system includes a voltage source configured to be electrically coupled to the first and second electrical terminals of the battery pack. The voltage source is further configured to apply a first output voltage level at a first time between the first and second electrical terminals when the first and second battery modules are not electrically coupled in series with one another. The system further includes a voltage meter configured to measure a first voltage level between the first electrical terminal and the housing when the first output voltage level is being output. The voltage meter is further configured to measure a second voltage level between the first electrical terminal and the housing, when the first output voltage level is being output, and a resistor is electrically coupled between the first electrical terminal and the housing. The resistor has a predetermined resistance level. The voltage meter is further configured to measure a third voltage level between the second electrical terminal and the housing when the first output voltage level is being output. The voltage meter is further configured to measure a fourth voltage level between the second electrical terminal and the housing, when the first output voltage level is being output, and the resistor is electrically coupled between the second electrical terminal and the housing. The system further includes a microprocessor programmed to operably communicate with the voltage meter. The microprocessor is further programmed to determine a first isolation resistance value associated with the battery pack at the first time based on the first voltage level, the second voltage level, the third voltage level, and the predetermined resistance level. The microprocessor is further programmed to determine a second isolation resistance value associated with the battery pack at the first time based on the first voltage level, the third voltage level, the fourth voltage level, and the predetermined resistance level. The microprocessor is further programmed to determine which of the first isolation resistance value and the second isolation resistance value has a smallest value relative to one another, and to store the smallest value of the first and second isolation resistance values in a memory device.

A method for determining isolation resistances of a battery pack in accordance with another exemplary embodiment is provided. The battery pack has a housing and at least first and second battery modules disposed in the housing. The battery pack further includes first and second electrical terminals. The method includes applying a first output voltage level at a first time between the first and second electrical terminals utilizing a voltage source when the first and second battery modules are not electrically coupled in series with one another. The method further includes measuring a first voltage level between the first electrical terminal and the housing when the first output voltage level is being output, utilizing a voltage meter. The method further includes measuring a second voltage level between the first electrical terminal and the housing utilizing the voltage meter, when the first output voltage level is being output, and a resistor is electrically coupled between the first electrical terminal and the housing. The resistor has a predetermined resistance level. The method further includes measuring a third voltage level between the second electrical terminal and the housing when the first output voltage level is being output, utilizing the voltage meter. The method further includes measuring a fourth voltage level between the second electrical terminal and the housing utilizing the voltage meter, when the first output voltage level is being output, and the resistor is electrically coupled between the second electrical terminal and the housing. The method further includes determining a first isolation resistance value associated with the battery pack at the first time utilizing a microprocessor based on the first voltage level, the second voltage level, the third voltage level, and the predetermined resistance level. The method further includes determining a second isolation resistance value associated with the battery pack at the first time utilizing the microprocessor based on the first voltage level, the third voltage level, the fourth voltage level, and the predetermined resistance level. The method further includes determining which of the first isolation resistance value and the second isolation resistance value has a smallest value relative to one another, and storing the smallest value of the first and second isolation resistance values in a memory device utilizing the microprocessor

DETAILED DESCRIPTION

Figure 1:
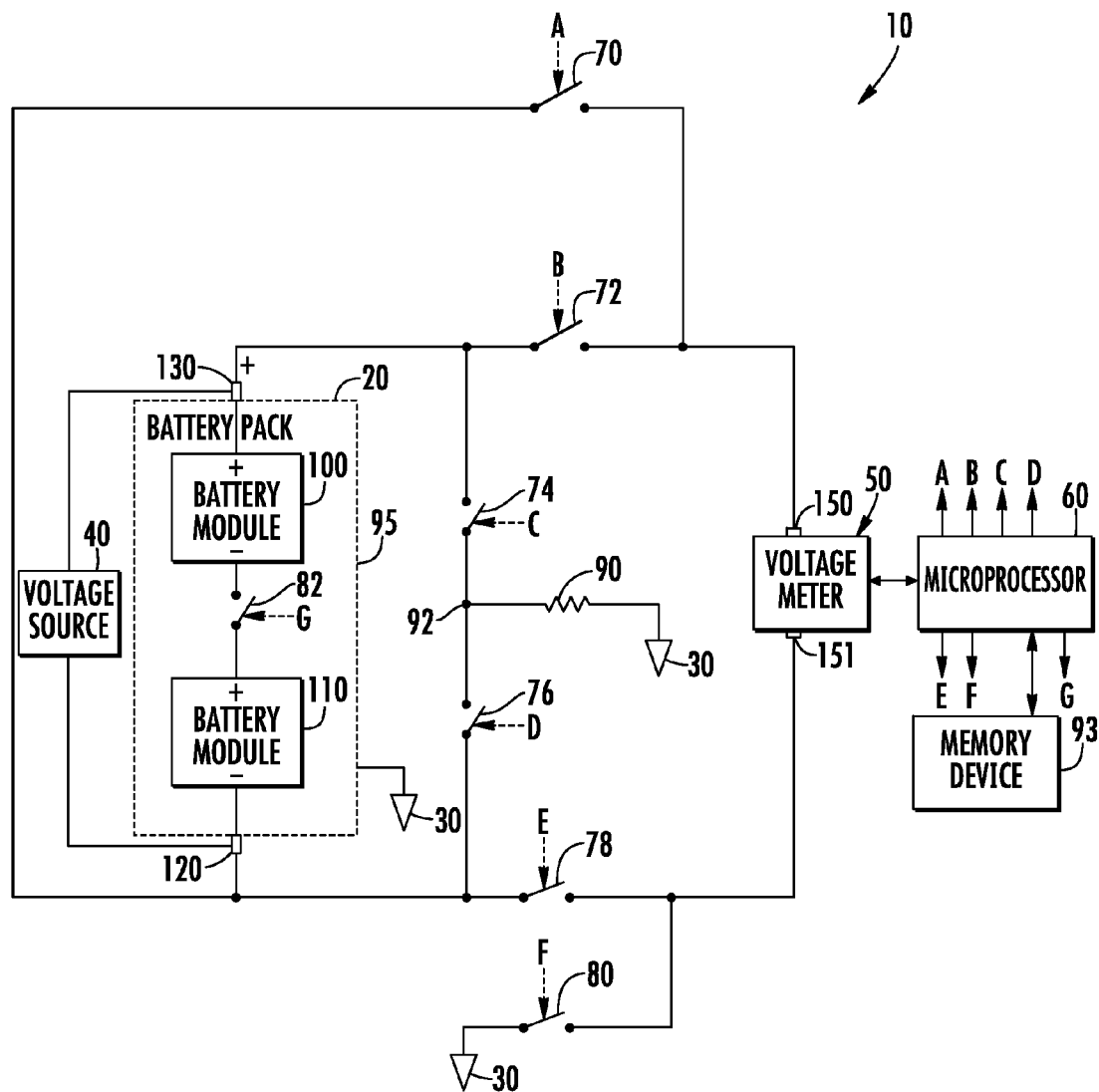
FIG. 1 is a schematic of a system for determining isolation resistances of a battery pack in accordance with an exemplary embodiment.

Referring to FIG. 1, a system 10 for determining isolation resistances of a battery pack 20 in accordance with an exemplary embodiment is provided. The system 10 includes a voltage source 40, a voltage meter 50, a microprocessor 60, electrical switches 70, 72, 74, 76, 78, 80, 82, a resistor 90, and a memory device 93. An advantage of the system 10 is that the system 10 utilizes the voltage source 40 that iteratively supplies predetermined voltages to the battery pack 20 while determining associated isolation resistances of the battery pack 20. Another advantage of the system 10 is that the battery pack 20 does not need to be fully-charged in order to determine the isolation resistances of the battery pack 20.

The battery pack 20 is provided to generate electrical power for either an electric vehicle or a hybrid electric vehicle. The battery pack 20 includes a housing 95, battery modules 100, 110, the electrical switch 82, a first electrical terminal 120, and a second electrical terminal 130. The housing 95 encloses the battery modules 100, 110 which are electrically coupled in series with one another. The first electrical terminal 120 is electrically coupled to a negative terminal of the battery module 110. The second electrical terminal 130 is electrical coupled to a positive terminal of the battery module 100. The negative terminal of the battery module 100 is electrically coupled to a first side of the switch 82. The positive terminal of the battery module 110 is electrically coupled to a second side of the electrical switch 82. The electrical switch 82 is an electrically-actuated switch and has a normally-closed operational position. The electrical switch 82 transitions to an open operational position in response to a control signal from the microprocessor 60 such that the battery modules 100, 110 are not electrically coupled in series with one another to allow the system 10 to perform the electrical isolation tests on the battery pack 20 as will be discussed in greater detail below.

In an alternative embodiment, the switch 82 could be removed such that the negative terminal of the battery module 110 is not electrically connected to the positive terminal of the battery module 110 when performing the electrical isolation tests described below. In other words, an open circuit would exist between the negative terminal of the battery module 100 and the positive terminal of the battery module 110 when performing the electrical isolations tests described below.

The vehicle chassis 30 is configured to hold the battery pack 20 thereon. The battery modules 100, 110 are selectively electrically coupled to the housing 95 for determining electrical isolation resistances of the battery pack 20. The housing 95 may be further electrically coupled to the vehicle chassis 30.

The voltage source 40 is configured to be electrically coupled to the first and second electrical terminals 120, 130 of the battery pack 20. The voltage source 40 is configured to apply output voltage levels between the first and second electrical terminals 120, 130 that are indicative of exemplary voltage levels to be output by the battery pack 20. In one exemplary embodiment, the voltage source 40 outputs voltages in a range of 100-600 Vdc. When the voltage source 40 outputs 600 Vdc, the voltage source 40 has an upper current limit of 10 milli-Amps.

The voltage meter 50 is configured to measure a first voltage level (V1) between the first electrical terminal 120 and the housing 95. When the voltage meter 50 measures the first voltage level (V1), the electrical switches 70, 80 each have a closed operational position, and the remaining switches have an open operational position. The voltage meter 50 is further configured to send data associated with the first voltage level (V1) to the microprocessor 60. In one exemplary embodiment, an internal resistance of the voltage meter 50 is at least 10 mega-Ohms.

The voltage meter 50 is further configured to measure a second voltage level (V2) between the first electrical terminal 120 and the housing 95 when a resistor 90 is electrically coupled between the first electrical terminal 120 and the housing 95. When the voltage meter 50 measures the second voltage level (V2), the electrical switches 70, 80, 76 each have a closed operational position, and the remaining switches have an open operational position. In one exemplary embodiment, the resistor 90 has a predetermined resistance level (R0), such as 200 kilo-Ohms for example. The voltage meter 50 is further configured to send data associated with the second voltage level (V2) to the microprocessor 60.

The voltage meter 50 is further configured to measure a third voltage level (V3) between the second electrical terminal 130 and the housing 95. When the voltage meter 50 measures the third voltage level (V3), the electrical switches 72, 80 each have a closed operational position, and the remaining switches have an open operational position. The voltage meter 50 is further configured to send data associated with the third voltage level (V3) to the microprocessor 60.

The voltage meter 50 is further configured to measure a fourth voltage level (V4) between the second electrical terminal 130 and the housing 95 when the resistor 90 is electrically coupled between the second electrical terminal 130 and the housing 95. When the voltage meter 50 measures the fourth voltage level (V4), the electrical switches 72, 74, 80 each have a closed operational position, and the remaining switches have an open operational position. The voltage meter 50 is further configured to send data associated with the fourth voltage level (V4) to the microprocessor 60.

The switches 70, 72, 74, 76, 78, 80 are electrically actuated switches. In particular, the switches 70-80 either have a closed operational position or an open operational position. The microprocessor 60 generates control signals which are received by the switches 70-80 which induce the switches to have a closed operational position. For example, the microprocessor 60 generates a control signal that is received by the switch 70 to induce the switch 70 to have a closed operational position. When the microprocessor 60 stops generating the control signals which are received by the switches 70-80, the switches transition to an open operational position. For example, when the microprocessor 60 stops generating a control signal that is received by the switch 70, the switch 70 transitions to an open operational position.

A brief description of the electrical configuration of the system 10 will now be provided. The switch 70 is electrically coupled between the first electrical terminal 120 of the battery pack 20 and the first electrical terminal 150 of the voltage meter 50. The switch 72 is electrically coupled between the second electrical terminal 130 of the battery pack 20 and the first electrical terminal 150 of the voltage meter 50. The switch 74 is electrically coupled between the electrical terminal 130 of the battery pack 20 and a node 92. The resistor 90 is electrically coupled between the node 92 and the housing 95. The switch 76 is electrically coupled between the node 92 and the first electrical terminal 120 of the battery pack 20. The switch 78 is electrically coupled between the first electrical terminal 120 of the battery pack 20 and the second electrical terminal 151 of the voltage meter 50. Further, the switch 80 is electrically coupled between the second electrical terminal 151 of the voltage meter 50 and the housing 95.

The microprocessor 60 is configured to operably communicate with the voltage meter 50. The microprocessor 60 is configured to determine a first isolation resistance value (R1) associated with the battery pack based on the following equation: $R1=R0\ (1+V3/V1)\ [(V1-V2)/V2]$. In an alternative embodiment, another isolation equation defined in one of the documents SAE1766, or FMVSS305, or ECE324 Rule 100 could be utilized to calculate R1 instead of the foregoing equation.

The microprocessor 60 is configured to determine a second isolation resistance value (R2) associated with the battery pack 20 based on the following equation: $R1=R0\ (1+V1/V3)\ [(V3-V4)/V4]$. In an alternative embodiment, another isolation equation defined in one of the documents SAE1766, or FMVSS305, or ECE324 Rule 100 could be utilized to calculate R1 instead of the foregoing equation.

Figure 2:
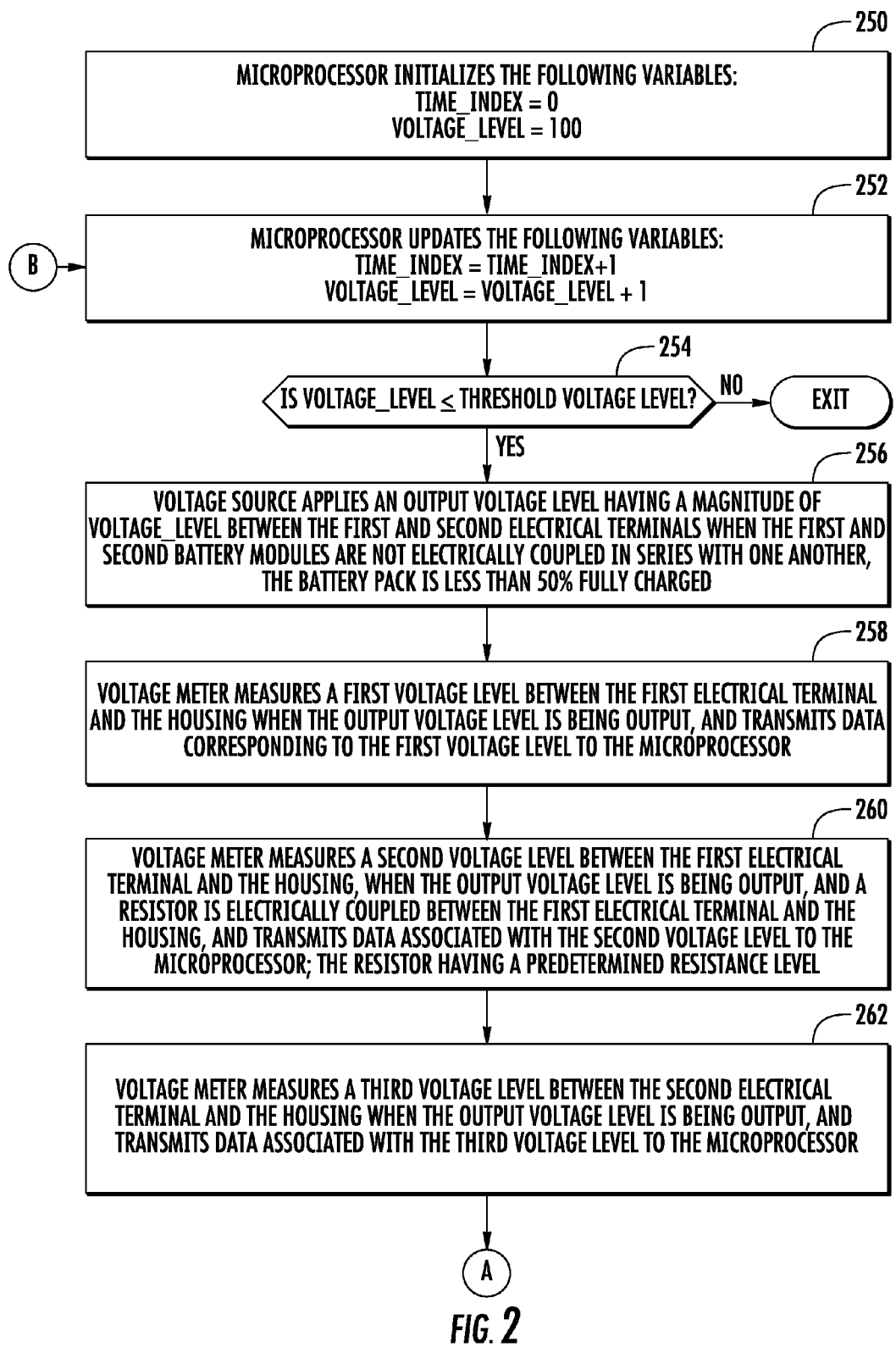
FIGS. 2-3 are flowcharts of a method for determining isolation resistances of a battery pack in accordance with another exemplary embodiment.
Figure 3:
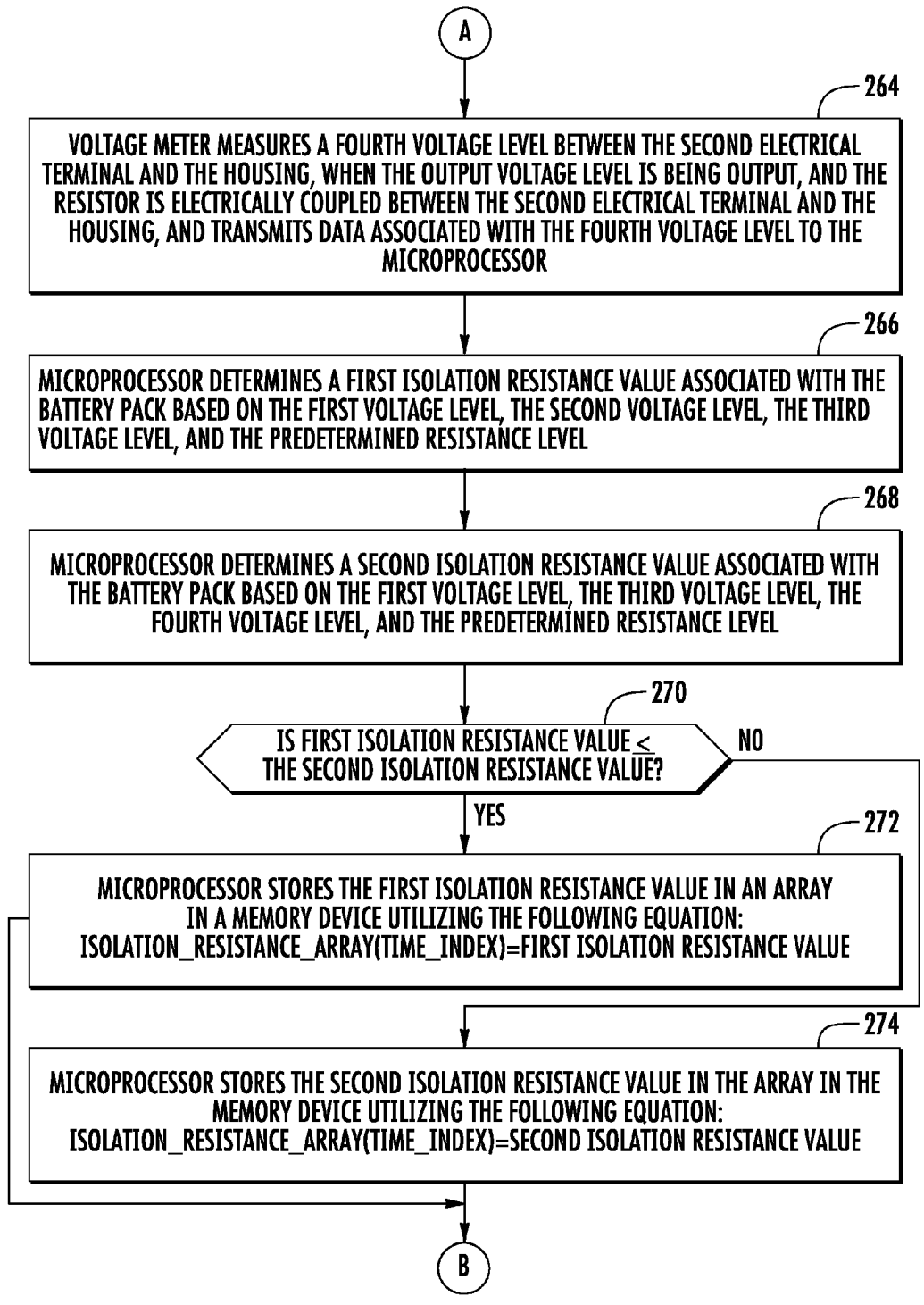

Referring to FIGS. 1-3, a flowchart of a method for determining an isolation resistance of the battery pack 20 in accordance with another exemplary embodiment will now be explained.

At step 250, the microprocessor 60 initializes the following variables: Time_Index=0; and Voltage_Level=100. After step 250, the method advances to step 252.

At step 252, the microprocessor 60 updates the following variables: Time_Index=Time_Index+1; and Voltage_Level=Voltage_Level+1. After step 252, the method advances to step 254.

At step 254, the microprocessor makes a determination as to whether the Voltage_Level is greater than or equal to the Threshold Voltage Level. If the value of step 254 equals "yes", the method advances to step 256. Otherwise, the method is exited.

At step 256, the voltage source 40 applies an output voltage level having a magnitude of Voltage_Level between the first and second electrical terminals 120, 130 when the battery modules 100, 110 are not electrically coupled in series with one another. In one exemplary embodiment, the battery pack is less than 50% fully charged. After step 256, the method advances to step 258.

At step 258, the voltage meter 50 measures a first voltage level (V1) between the first electrical terminal 120 and the housing 95 when the output voltage level is being output, and transmits data corresponding to the first voltage level (V1) to the microprocessor 60. After step 258, the method advances to step 260.

At step 260, the voltage meter 50 measures a second voltage level (V2) between the first electrical terminal 120 and the housing 95, when the output voltage level is being output, and a resistor 90 is electrically coupled between the first electrical terminal 120 and the housing 95, and transmits data associated with the second voltage level (V2) to the microprocessor 60. The resistor 90 has a predetermined resistance level. After step 260, the method advances to step 262.

At step 262, the voltage meter 50 measures a third voltage level (V3) between the second electrical terminal 130 and the housing 95 when the output voltage level is being output, and transmits data associated with the third voltage level (V3) to the microprocessor 60. After step 262, the method advances to step 264.

At step 264, the voltage meter 50 measures a fourth voltage level (V4) between the second electrical terminal 130 and the housing 95, when the output voltage level is being output, and the resistor 90 is electrically coupled between the second electrical terminal and the housing 95, and transmits data associated with the fourth voltage level (V4) to the microprocessor 60. After step 264, the method advances to step 266.

At step 266, the microprocessor 60 determines a first isolation resistance value (R1) associated with the battery pack 20 based on the first voltage level (V1), the second voltage level (V2), the third voltage level (V3), and the predetermined resistance level. After step 266, the method advances to step 268.

At step 268, the microprocessor 60 determines a second isolation resistance value (R2) associated with the battery pack 20 based on the first voltage level (V1), the third voltage level (V3), the fourth voltage level (V4), and the predetermined resistance level. After step 268, the method advances to step 270.

At step 270, the microprocessor 60 makes a determination as to whether the first isolation resistance value (R1) is less than or equal to the second isolation resistance value (R2). If the value of step 270 equals "yes", the method advances to step 272. Otherwise, the method advances to step 274.

At step 272, the microprocessor 60 stores the first isolation resistance value (R1) in an array in the memory device 93 utilizing the following equation: Isolation_Resistance_Array (Time_Index)=first isolation resistance value (R1). After step 272, the method returns to step 252.

Referring again to step 270, if the value of step 270 equals "no", the step 274 is performed. At step 274, the microprocessor 60 stores the second isolation resistance value (R2) in the array in the memory device 93 utilizing the following equation: Isolation_Resistance_Array(Time_Index)=second isolation resistance value (R2). After step 274, the method returns to step 252.

The above-described method can be at least partially embodied in the form of one or more computer readable media having computer-executable instructions for practicing the method. The computer-readable media can comprise one or more of the following: hard drives, flash memory, CD-ROMs, and other computer-readable media known to those skilled in the art; wherein, when the computer-executable instructions are loaded into and executed by one or more microprocessors or computers, the one or more microprocessors or computers become an apparatus for practicing the invention and are programmed to perform the above method.

Figure 4:
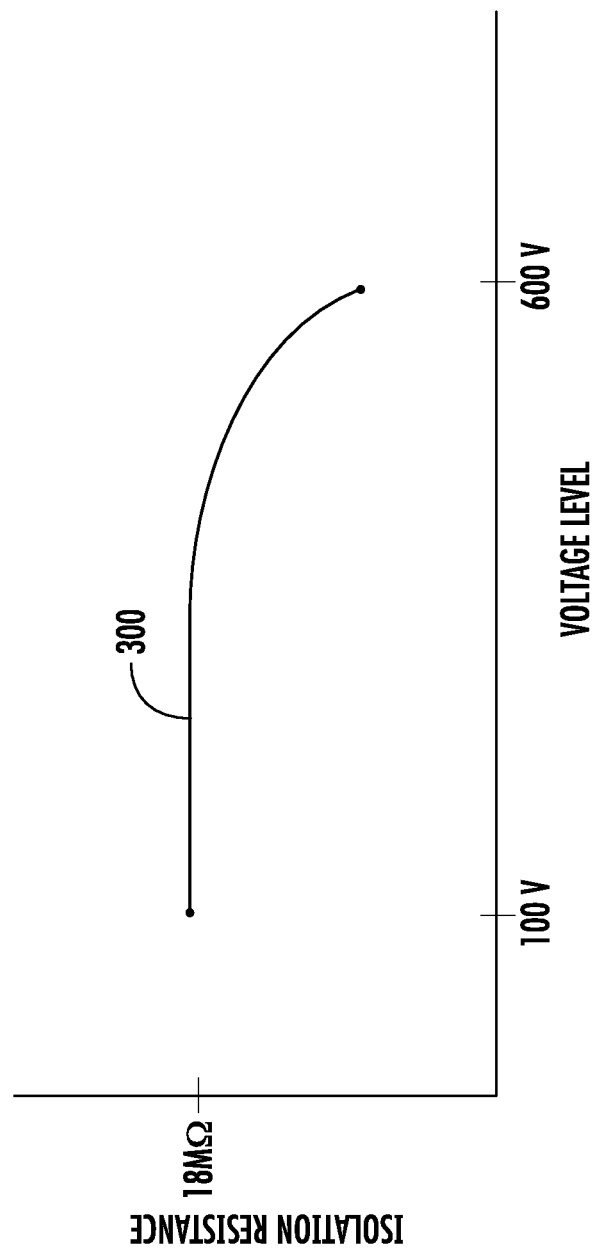
FIG. 4 is a graph of an exemplary isolation resistance curve of a battery pack that can be determined utilizing the system of FIG. 1.

Referring to FIG. 4, a graph of an exemplary isolation resistance curve 300 associated with the battery pack 20 that can be determined utilizing the system 10 is illustrated. The graph has an X-axis corresponding to voltage levels applied to the battery pack 20 by the voltage source 40. The graph further includes a Y-axis corresponding to isolation resistances of the battery pack 20. As shown, the isolation resistance of the battery pack 20 varies as the voltage level applied to the battery pack 20 is varied.

The system and the method for determining isolation resistances of the battery pack 20 provide a substantial advantage over other systems and methods. In particular, the system 10 and the method provide a technical effect of utilizing a voltage source that supplies predetermined voltages to the battery pack 20 while determining isolation resistances of the battery pack 20, such that the battery pack 20 does not need to be fully-charged in order to determine the isolation resistances.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A system for determining isolation resistances of a battery pack, the battery pack having a housing and at least first and second battery modules disposed in the housing, the battery pack further having first and second electrical terminals, comprising:

a voltage source configured to be electrically coupled to the first and second electrical terminals of the battery pack, the voltage source further configured to apply a first output voltage level at a first time between the first and second electrical terminals when the first and second battery modules are not electrically coupled in series with one another;

a voltage meter configured to measure a first voltage level between the first electrical terminal and the housing when the first output voltage level is being output;

the voltage meter further configured to measure a second voltage level between the first electrical terminal and the housing, when the first output voltage level is being output, and a resistor is electrically coupled between the first electrical terminal and the housing; the resistor having a predetermined resistance level;

the voltage meter further configured to measure a third voltage level between the second electrical terminal and the housing when the first output voltage level is being output;

the voltage meter is further configured to measure a fourth voltage level between the second electrical terminal and the housing, when the first output voltage level is being output, and the resistor is electrically coupled between the second electrical terminal and the housing;

a microprocessor programmed to operably communicate with the voltage meter, the microprocessor further programmed to determine a first isolation resistance value associated with the battery pack at the first time based on the first voltage level, the second voltage level, the third voltage level, and the predetermined resistance level;

the microprocessor further programmed to determine a second isolation resistance value associated with the battery pack at the first time based on the first voltage level, the third voltage level, the fourth voltage level, and the predetermined resistance level; and the microprocessor further programmed to determine which of the first isolation resistance value and the second isolation resistance value has a smallest value relative to one another, and to store the smallest value of the first and second isolation resistance values in a memory device.

2. The system of claim 1, wherein:

the voltage source further configured to apply a second output voltage level at a second time between the first and second electrical terminals when the first and second battery modules are not electrically coupled in series with one another, the second time being after the first time, the second output voltage level being greater than the first output voltage level;

the voltage meter further configured to measure a fifth voltage level between the first electrical terminal and the housing when the second output voltage level is being output;

the voltage meter further configured to measure a sixth voltage level between the first electrical terminal and the housing, when the second output voltage level is being output, and the resistor is electrically coupled between the first electrical terminal and the housing;

the voltage meter further configured to measure a seventh voltage level between the second electrical terminal and the housing when the second output voltage level is being output;

the voltage meter is further configured to measure an eighth voltage level between the second electrical terminal and the housing, when the second output voltage level is being output, and the resistor is electrically coupled between the second electrical terminal and the housing;

the microprocessor further programmed to determine a third isolation resistance value associated with the battery pack at the second time based on the fifth voltage level, the sixth voltage level, the seventh voltage level, and the predetermined resistance level;

the microprocessor further programmed to determine a fourth isolation resistance value associated with the battery pack at the second time based on the fifth voltage level, the seventh voltage level, the eighth voltage level, and the predetermined resistance level; and the microprocessor further programmed to determine which of the third isolation resistance value and the fourth isolation resistance value has a smallest value relative to one another, and to store the smallest value of the third and fourth isolation resistance values in the memory device.

3. The system of claim 1, wherein the battery pack is less than 50% fully charged.

4. A method for determining isolation resistances of a battery pack, the battery pack having a housing and at least first and second battery modules disposed in the housing, the battery pack further having first and second electrical terminals, comprising:

applying a first output voltage level at a first time between the first and second electrical terminals utilizing a voltage source when the first and second battery modules are not electrically coupled in series with one another;

measuring a first voltage level between the first electrical terminal and the housing when the first output voltage level is being output, utilizing a voltage meter;

measuring a second voltage level between the first electrical terminal and the housing utilizing the voltage meter, when the first output voltage level is being output, and a resistor is electrically coupled between the first electrical terminal and the housing; the resistor having a predetermined resistance level;

measuring a third voltage level between the second electrical terminal and the housing when the first output voltage level is being output, utilizing the voltage meter;

measuring a fourth voltage level between the second electrical terminal and the housing utilizing the voltage meter, when the first output voltage level is being output, and the resistor is electrically coupled between the second electrical terminal and the housing;

determining a first isolation resistance value associated with the battery pack at the first time utilizing a microprocessor based on the first voltage level, the second voltage level, the third voltage level, and the predetermined resistance level;

determining a second isolation resistance value associated with the battery pack at the first time utilizing the microprocessor based on the first voltage level, the third voltage level, the fourth voltage level, and the predetermined resistance level; and determining which of the first isolation resistance value and the second isolation resistance value has a smallest value relative to one another, and storing the smallest value of the first and second isolation resistance values in a memory device utilizing the microprocessor.

5. The method of claim 4, further comprising:

applying a second output voltage level at a second time between the first and second electrical terminals utilizing the voltage source when the first and second battery modules are not electrically coupled in series with one another, the second time being after the first time, the second output voltage level being greater than the first output voltage level;

measuring a fifth voltage level between the first electrical terminal and the housing when the second output voltage level is being output, utilizing a voltage meter;

measuring a sixth voltage level between the first electrical terminal and the housing utilizing the voltage meter, when the second output voltage level is being output, and the resistor is electrically coupled between the first electrical terminal and the housing;

measuring a seventh voltage level between the second electrical terminal and the housing when the second output voltage level is being output, utilizing the voltage meter;

measuring an eighth voltage level between the second electrical terminal and the housing utilizing the voltage meter, when the second output voltage level is being output, and the resistor is electrically coupled between the second electrical terminal and the housing;

determining a third isolation resistance value associated with the battery pack at the second time utilizing a microprocessor based on the fifth voltage level, the sixth voltage level, the seventh voltage level, and the predetermined resistance level;

determining a fourth isolation resistance value associated with the battery pack at the second time utilizing the microprocessor based on the fifth voltage level, the seventh voltage level, the eighth voltage level, and the predetermined resistance level; and determining which of the third isolation resistance value and the fourth isolation resistance value has a smallest value relative to one another, and storing the smallest value of the third and fourth isolation resistance values in the memory device utilizing the microprocessor.

* * * * *